(12) United States Patent
Tsai et al.

(10) Patent No.: US 9,318,213 B2
(45) Date of Patent: Apr. 19, 2016

(54) DATA STORAGE DEVICE AND FLASH MEMORY CONTROL METHOD

(71) Applicant: VIA TECHNOLOGIES, INC., New Taipei (TW)

(72) Inventors: Chin-Yin Tsai, New Taipei (TW); Yi-Lin Lai, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 71 days.

(21) Appl. No.: 14/317,138

(22) Filed: Jun. 27, 2014

(65) Prior Publication Data
US 2015/0016191 A1 Jan. 15, 2015

Related U.S. Application Data

(60) Provisional application No. 61/845,065, filed on Jul. 11, 2013.

(30) Foreign Application Priority Data

Feb. 14, 2014 (TW) .............. 103104843 A

(51) Int. Cl.
G06F 13/00 (2006.01)
G06F 13/28 (2006.01)
G11C 16/32 (2006.01)
G11C 29/02 (2006.01)
G11C 29/12 (2006.01)

(52) U.S. Cl.
CPC .............. *G11C 16/32* (2013.01); *G11C 29/023* (2013.01); *G11C 29/028* (2013.01); *G11C 29/12015* (2013.01)

(58) Field of Classification Search
CPC ................. G11C 16/32; G11C 29/023; G11C 29/12015; G11C 29/028
See application file for complete search history.

(56) References Cited

U.S. PATENT DOCUMENTS

| 7,096,137 | B2 | 8/2006 | Shipton et al. | |
| 2008/0080276 | A1* | 4/2008 | Lin | G11C 29/14 365/201 |
| 2008/0301507 | A1 | 12/2008 | Behera et al. | |

FOREIGN PATENT DOCUMENTS

TW        I349976        10/2011

* cited by examiner

*Primary Examiner* — Eric S Cardwell
(74) *Attorney, Agent, or Firm* — McClure, Qualey & Rodack, LLP

(57) ABSTRACT

An overclocking process for a data storage device using a flash memory. A controller for the flash memory tests the flash memory using test clocks with various frequencies to determine at least one clock signal suitable to the flash memory. The clock candidates suitable to the flash memory are selected from the test clocks. The flash memory is operated in a variable-frequency manner by which the flash memory is switched between the clock candidates, such that electromagnetic interference is spread over different bands.

16 Claims, 4 Drawing Sheets

DATA STORAGE DEVICE AND FLASH MEMORY CONTROL METHOD

CROSS REFERENCE TO RELATED APPLICATIONS

This application claims the benefit of U.S. Provisional Application No. 61/845,065, filed on Jul. 11, 2013, the entirety of which is incorporated by reference herein.

This application further claims priority of Taiwan Patent Application No. 103104843, filed on Feb. 14, 2014, the entirety of which is incorporated by reference herein.

BACKGROUND OF THE INVENTION

1. Field of the Invention

The present invention relates to a data storage device using a flash memory and it particularly relates to a flash Memory control method.

2. Description of the Related Art

Flash memory, a data storage medium, is common in today's data storage devices. For example, a flash memory is typically used in memory cards, USB flash devices, solid-state drives, and so on. In another application with a multi-chip package technology, a NAND flash chip and a controller chip are combined in one package as an embedded MultiMediaCard (eMMC).

Flash memory is widely used in various applications and its storage capacity grows with the advances in semiconductor technology. Large-sized flash memory, however, may result in poor yields. The vendor typically has to drop down the maximum support clock frequency of the poor flash memory to make sure the reliability of the poor flash memory.

BRIEF SUMMARY OF THE INVENTION

A data storage device using a flash memory and a flash memory control method are disclosed, relating to an overclocking process.

A data storage device in accordance with an exemplary embodiment of the disclosure comprises a flash memory and a controller coupled to the flash memory. The controller tests the flash memory by a plurality of test clocks with various frequencies and to determine at least one clock signal suitable to the flash memory and operates the flash memory in accordance with the clock signals suitable to the flash memory.

A flash memory control method in accordance with an exemplary embodiment of the disclosure comprises the following steps: testing a flash memory by a plurality of test clocks with various frequencies to determine at least one clock signal suitable to the flash memory; and operating the flash memory in accordance with the clock signals suitable to the flash memory.

In one exemplary embodiment, several clock candidates suitable to the flash memory are determined. The clock candidates may oscillate at different frequencies. The flash memory may be switched between the different clock candidates to spread the electromagnetic interference over several bands.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
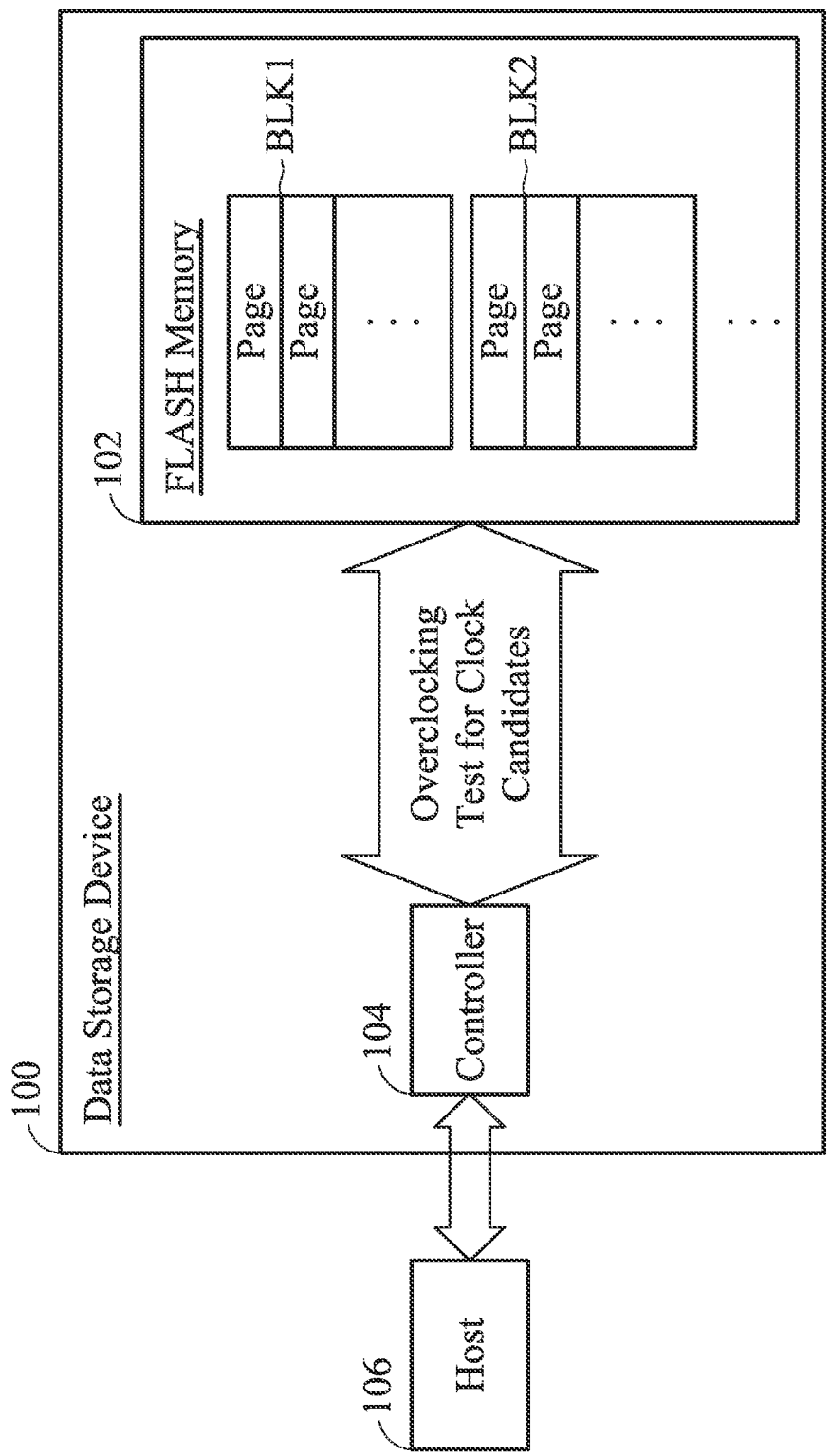
FIG. 1 depicts a data storage device 100 in accordance with an exemplary embodiment of the disclosure.

FIG. 1 depicts a data storage device 100 in accordance with an exemplary embodiment of the disclosure, which comprises a flash memory 102 and a controller 104 coupled to the flash memory 102. As shown, the storage space of the flash memory 102 is divided into a plurality of blocks BLK1, BLK2 . . . . Each block includes a plurality of pages. To release one block for reuse, the entire space of the block has to be erased. Typically, for a flash memory, a write operation is more complex than a read operation and will dominate the operating clock of the flash memory 102.

In addition to controlling the data transmission between the host 106 and flash memory 102, the controller 104 further performs an overclocking test on the flash memory 102. When the overclocking test is successful, the controller 104 operates the flash memory 102 with a clock signal having a frequency greater than the maximum support clock frequency of the flash memory 102. The maximum support clock frequency of the flash memory 102 may be set by the vendor, e.g. just 300 MHz. Once the overclocking test is successful, the controller 104 is permitted to operate the flash memory 102 with an overclocking clock, e.g., 333 MHz, faster than the maximum support clock frequency. In an exemplary embodiment, the controller 104 tests the flash memory 102 by using test clocks with various frequencies to determine at least one clock signal suitable to the flash memory 102 and operate the flash memory 102 in accordance with the clock signals suitable to the flash memory 102.

In an exemplary embodiment, the controller 104 is coupled to the flash memory 102 via a data transmission line. When the controller 104 tests the flash memory 102 by one of the test clocks, a response signal is returned from the flash memory 102 through the data transmission line. Based on the response signal, the controller 104 may determine whether the test clock under test is the clock signal suitable to the flash memory 102. In an exemplary embodiment, the controller 104 moves a sampling point, indicated by the test clock which is being tested, of the response signal for determination of the clock signal suitable to the flash memory. For example, the controller 104 may forward shift or backward shift the sampling point of the response signal for accurate accusation of the response signal or to reduce a bit error rate lower than a specific value (depending on the user). When the response signal is accurately acquired or is sampled at a bit error rate lower than the specific value, the controller 104 may determine that the test clock has passed the overclocking test. In an exemplary embodiment, the controller 104 starts the overclocking test from a test clock oscillating at the maximum frequency of the various frequencies and gradually slows the flash memory 102 under the overclocking test by switching between the test clocks. When the test clock at a maximum frequency fails the overclocking test, the controller 104 may be switched to test the flash memory 102 by the test clock oscillating at the second maximum frequency of the various frequencies. The remaining may be deduced by analogy. In other words, the controller 104 may start an overclocking test from the test clock oscillating at the maximum frequency and then gradually reduce the clock frequency during the overclocking test of the flash memory 102 between the test clocks.

Between the controller 104 and the flash memory 102, the data transmission line is driven in accordance with one set of driving parameters. In addition to verifying the response signal by moving the sampling point of the response signal, the set of driving parameters of the data transmission line between the controller 104 and the flash memory 102 may also be adjusted during the overclocking test. In an exemplary embodiment, the controller 104 adjusts (e.g., enhances or suppresses) the set of driving parameters for the response signal transmitted on the data transmission line to be accurately acquired by the controller 104. In another exemplary embodiment, the controller 104 switches the flash memory 102 to operate at a single data rate (SDR) for the response signal transmitted on the data transmission line to be accurately acquired by the controller 104.

Figure 2:
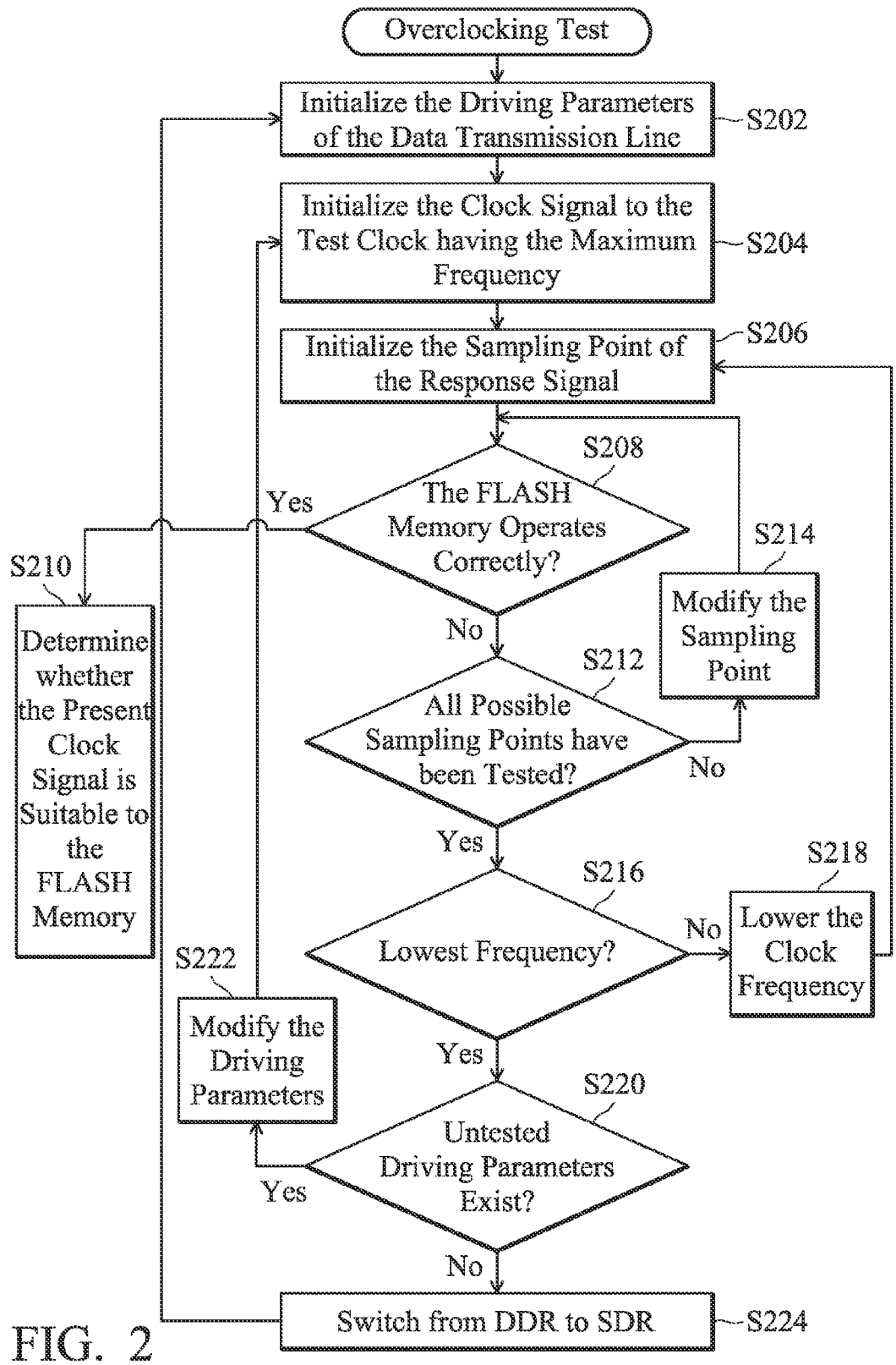
FIG. 2 is a flowchart depicting an overclocking test of a flash memory in accordance with an exemplary embodiment of the disclosure.

FIG. 2 is a flowchart depicting an overclocking test of a flash memory in accordance with an exemplary embodiment of the disclosure. In step S202, the driving parameters of the data transmission line between the controller 104 and the flash memory 102 are initialized. In step S204, a clock signal initialization for the overclocking test is performed to apply the test clock at the maximum frequency to the flash memory 102. In step S206, the sampling point indicated by the clock signal is initialized. In step S208, it is checked whether the flash memory 102 operates correctly with the present clock signal. For example, test data written into the flash memory 102 is then read out from the flash memory 102 and verified. In an exemplary embodiment, the test data is a default data stored in the controller 104. When it is determined in step S208 that the flash memory 102 operates correctly, step S210 is performed to determine that the present clock signal is suitable to the flash memory 102.

When it is determined in step S208 that the flash memory 102 operates incorrectly, step S212 is performed to check whether all possible sampling points are tested. In an exemplary embodiment, there are 32 sampling points for selection. When there are still other sampling points to be tested, step S214 is performed to change the sampling point and then step S208 is repeated.

When it is determined in step S212 that all possible sampling points have been tested, step S216 is performed to check whether the last tested clock signal is the slowest clock signal of the various frequencies of the clock signals. When the last tested clock signal is not the slowest clock signal, step S218 is performed to lower the clock frequency and then step S206 is repeated.

When it is determined in step S216 that all possible oscillation frequencies have been tested, step S220 is performed to check whether there are other options for the driving parameters of the data transmission line. If yes, step S222 is performed to change the driving parameters and then step S204 is repeated.

When it is determined in step S220 that all possible driving parameters have been tested, step S224 is performed and data transmission rate of the flash memory 102 is switched from a double data rate to a single data rate and then step S202 is repeated.

In accordance with the procedure of FIG. 2, the clock signal suitable to the flash memory 102 is obtained, and the oscillation frequency of the clock signal and the sampling point of the response signal are determined. Furthermore, the need to change the driving parameters of the data transmission line or switch the flash memory 102 to the single data rate is met by the procedure of FIG. 2. In accordance with the procedure of FIG. 2, the flash memory 102 is operated with a proper clock signal and a proper data rate while proper driving parameters are applied on data transmission line.

In other exemplary embodiments, different operation modes of a flash memory 102 may require different clock signals. The different clock signals suitable to different modes of the flash memory 102 may be separately verified and determined by the disclosed overclocking test.

In an exemplary embodiment, the controller 104 may select more than one clock signals from the test clocks as clock candidates suitable to the flash memory 102, to operate the flash memory 102 in a variable-frequency manner to switch the clock signal of the flash memory between the clock candidates. For example, the clock signal having the maximum clock frequency of the various frequencies at which the flash memory 102 operates correctly is symbolized by the symbol CLK_Max. Based on the clock signal CLK_Max with the maximum clock frequency suitable to the flash memory 102, the controller 104 may further search a clock signal CLK_Alt having the second maximum clock frequency of the various frequencies at which the flash memory 102 operates correctly. The clock signal CLK_Max oscillating at the maximum clock frequency and the clock signal CLK_Alt oscillating at the second maximum frequency may be determined to be clock candidates for the flash memory 102. The flash memory 102 is switched between the clock candidates (including the CLK_Max and CLK_Alt). In this manner, the electromagnetic interference (EMI) is spread over different bands. This example is not intended to limit the number of clock candidates, and the clock candidates may be clock signals other than clock signals CLK_Max and CLK_Alt. The selection of the clock candidates depends on the user's requirements.

Figure 3:
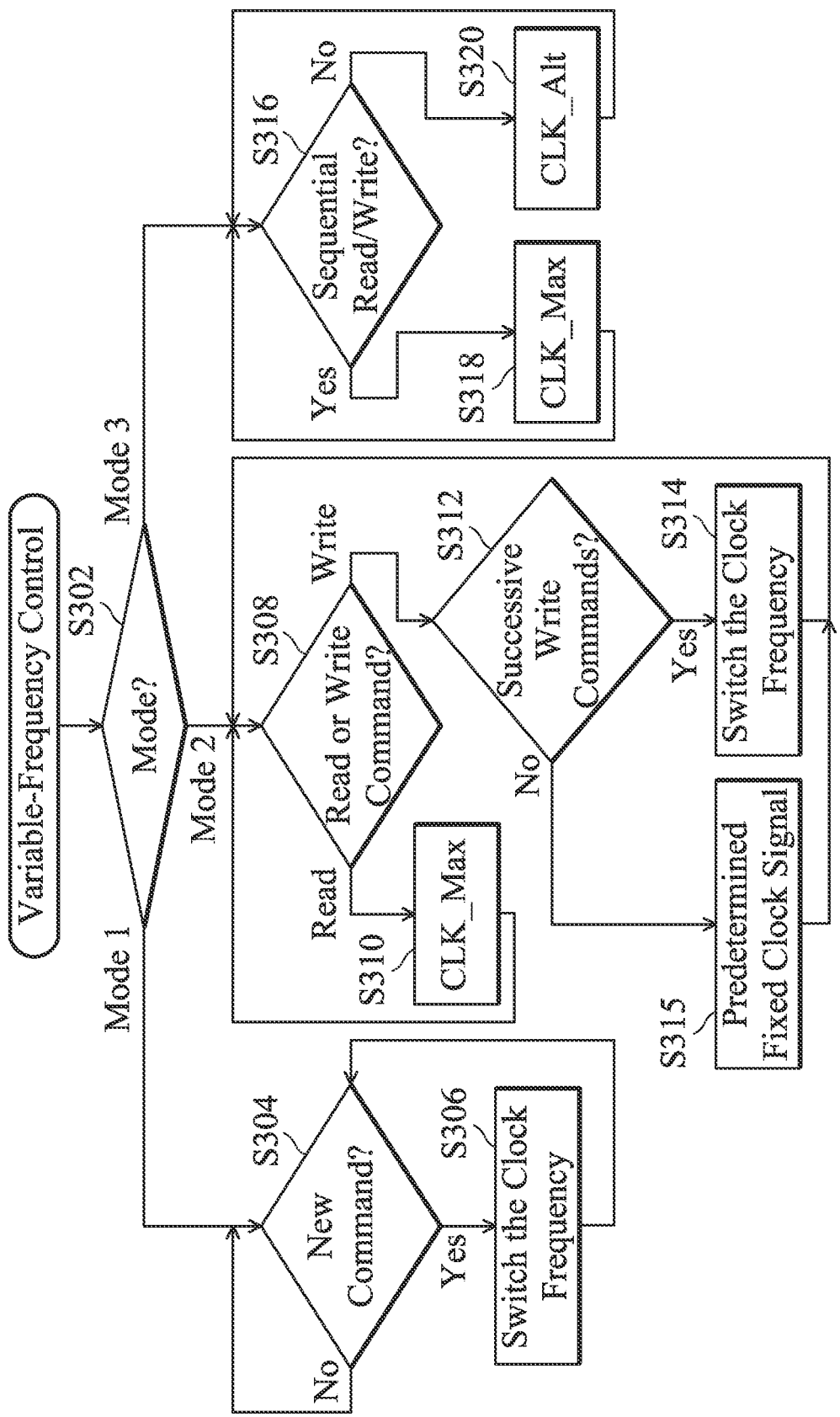
FIG. 3 depicts how a flash memory is operated at a variable frequency.

The variable frequency control may change with the operation mode of the flash memory 102. FIG. 3 depicts how a flash memory is operated at a variable frequency.

When it is determined in step S302 that the flash memory 102 is operating in mode 1, step S304 is performed. The controller 104 switches the clock frequency of the flash memory 102 (S306) every time the controller 104 issues a command to the flash memory 102. Corresponding to a first command issued from the controller 104, the flash memory 102 is operated in accordance with the clock signal CLK_Max at the maximum clock frequency suitable to the flash memory 102. Corresponding to a second command issued from the controller 104 and next to the first command, the flash memory 102 is operated in accordance with the clock signal CLK_Alt at the second maximum clock frequency suitable to the flash memory 102. Corresponding to a third command issued from the controller 104 and next to the second command, the flash memory 102 is operated in accordance with the clock signal CLK_Max at the maximum clock frequency suitable to the flash memory 102 respectively.

When it is determined in step S302 that the flash memory 102 is operating in mode 2, step S308 is performed to identify the command type. Step S310 is performed for read commands. In step S310, the flash memory 102 is operated in accordance with the clock signal CLK_Max at the maximum clock frequency suitable to the flash memory 102. When a command issued from the controller 104 is a write command, step S312 is performed to check whether the previous command was also a write command. When it is determined in step S312 that the previous command was also a write command, step S314 is performed to switch the clock frequency. In this manner, the clock signal of the flash memory 102 is switched between the clock signal CLK_Max and the clock signal CLK_Alt when successive write commands are performed. Because a write operation is more time consuming than a read operation, the disclosed variable-frequency control effectively prevents the electromagnetic interference (EMI) from concentrating in a narrow band. Furthermore, when it is determined in step S312 that the previous command was not a write command, step S315 is performed to operate the flash memory 102 with a predetermined fixed clock signal. In an exemplary embodiment, the predetermined fixed clock signal is the clock signal CLK_Alt at the second maximum clock frequency suitable to the flash memory 102. In other exemplary embodiments, when writing data into the flash memory 102, the oscillation frequency of the clock signal is down-converted by a fixed ratio to be lower than the clock signal CLK_Alt, to oscillate at a frequency lower than the second maximum clock frequency suitable to the flash memory 102.

When it is determined in step S302 that the flash memory 102 is operating in mode 3, step S316 is performed to identify the data type of the read/write command. Step S318 is performed for sequential read/write operations, to operate the flash memory 102 in accordance with the clock signal CLK_Max oscillating at the maximum clock frequency suitable to the flash memory 102. Step S320 is performed for random read/write operations, to operate the flash memory 102 in accordance with the clock signal CLK_Alt oscillating at the second maximum clock frequency suitable to the flash memory 102. Because a random read/write operation is much more complex than a sequential read/write operation, the disclosed variable-frequency control effectively prevents the electromagnetic interference (EMI) from concentrating in a narrow band. In another exemplary embodiment, when randomly writing/reading the flash memory 102, clock signal of the flash memory 102 is switched between the clock signal CLK_Max and the clock signal CLK_Alt and thereby the electromagnetic interference is spread over different bands.

Figure 4:
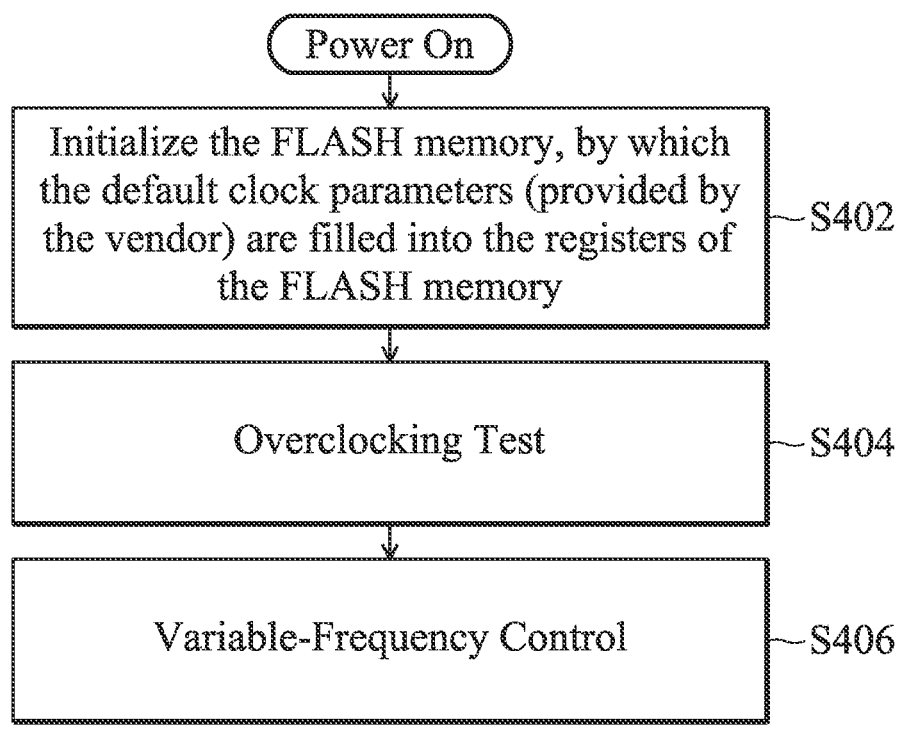
FIG. 4 is a flowchart depicting how a flash memory is operated, which includes the overclocking test and how the flash memory is operated at a variable frequency.

FIG. 4 is a flowchart depicting how a flash memory is operated, which includes the overclocking test and how the flash memory is operated at a variable frequency. After powering on the flash memory 102, step S402 is performed to initialize the flash memory 102. The default clock parameters (provided by the vendor) are filled into the registers of the flash memory 102 and thereby the flash memory 102 is operated at a just acceptable oscillation frequency. In step S404, an overclocking test (shown in FIG. 2) is performed on the flash memory 102 and the clock candidates suitable to the flash memory 102 are determined. In step S406, the flash memory 102 is operated in a variable-frequency manner (e.g., switched between mode 1, mode 2 and mode 3 of FIG. 3). Thus, the clock signal of the flash memory 102 is switched between the clock candidates and the electromagnetic interference is spread over different bands. By the overclocking test of step S404, the operating clock signal is modified dynamically with aging degree of the flash memory 102.

The controller 104 may be a specially designed chip or be implanted by a computing unit and a read-only memory (ROM). The aforementioned technical steps may be performed by executing firmware codes stored in a ROM of a controller. The ROM code is executed by a computing unit of the controller. Any technique using the aforementioned concept to control a flash memory is within the scope of the invention. The invention further involves flash memory control methods, which are not limited to any specific controller architecture.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory; and
   a controller coupled to the flash memory, wherein the controller tests the flash memory by a plurality of test clocks with various frequencies to determine at least one clock signal suitable to the flash memory and operates the flash memory in accordance with the clock signal suitable to the flash memory,
   wherein:
   the flash memory returns a response signal when the controller tests the flash memory by one of the test clocks; and
   the controller moves a sampling point, indicated by a test clock which is being tested, corresponding to the response signal when determining the clock signal suitable to the flash memory.

2. The data storage device as claimed in claim 1, wherein:
   the controller determines clock candidates suitable to the flash memory from the test clocks and operates the flash memory in a variable-frequency manner to switch the clock signal of the flash memory between the clock candidates.

3. The data storage device as claimed in claim 2, wherein:
   the controller determines the highest and the next highest frequencies of the various frequencies suitable to the flash memory for determining the clock candidates; and
   the controller switches the clock signal of the flash memory between the highest and the next highest frequencies of the various frequencies suitable to the flash memory every time the controller issues a command to the flash memory.

4. The data storage device as claimed in claim 2, wherein:
   the controller determines the highest and the next highest frequencies of the various frequencies suitable to the flash memory for determining the clock candidates;
   to read the flash memory, the controller operates the flash memory at the highest frequency of the various frequencies suitable to the flash memory; and
   to write the flash memory, the controller operates the flash memory at the next highest frequency of the various frequencies suitable to the flash memory or switches the clock signal of the flash memory between the the highest and the next highest frequencies of the various frequencies suitable to the flash memory.

5. The data storage device as claimed in claim 2, wherein:
   the controller determines the highest and the next highest frequencies of the various frequencies suitable to the flash memory for determining the clock candidates;
   to sequentially read or write the flash memory, the controller operates the flash memory at the highest frequency of the various frequencies suitable to the flash memory; and
   to randomly read or write the flash memory, the controller operates the flash memory at the next highest frequency of the various frequencies suitable to the flash memory or switches the clock signal of the flash memory between the highest and the next highest frequencies of the various frequencies suitable to the flash memory.

6. The data storage device as claimed in claim 1, wherein: the controller starts an overclocking test of the flash memory from a test clock at a maximum frequency of the various frequencies and gradually slows the flash memory under the overclocking test by switching between the test clocks.

7. The data storage device as claimed in claim 1, wherein: a data transmission line between the controller and the flash memory is driven in accordance with one set of driving parameters; and
when testing the flash memory by the test clocks, the controller further modifies the set of driving parameters for correct acquisition of data transmitted on the data transmission line.

8. The data storage device as claimed in clam 1, wherein: a data transmission line is coupled between the controller and the flash memory; and
the controller further switches the flash memory to operate at a single data rate for correct acquisition of data transmitted on the data transmission line.

9. A flash memory control method, comprising:
testing a flash memory by a plurality of test clocks with various frequencies;
determining a clock signal suitable to the flash memory based on testing the flash memory by the test clocks;
operating the flash memory with the clock signal suitable to the flash memory;
driving the flash memory to return a response signal when the flash memory is tested by one of the test clocks; and
shifting the clock signal to move a sampling point corresponding to the response signal for determination of the clock signal suitable to the flash memory.

10. The flash memory control method as claimed in claim 9, further comprising:
determining clock candidates suitable to the flash memory from the test clocks and operating the flash memory in a variable-frequency manner to switch the clock signal of the flash memory between the clock candidates.

11. The flash memory control method as claimed in claim 10, wherein:
the highest and the next highest frequencies of the various frequencies suitable to the flash memory are determined for determining the clock candidates; and
the clock signal of the flash memory is switched between the highest and the next highest frequencies of the various frequencies suitable to the flash memory every time a command is issued to the flash memory.

12. The flash memory control method as claimed in claim 10, wherein:
the highest and the next highest frequencies of the various frequencies suitable to the flash memory are determined for determining the clock candidates;
to read the flash memory, the flash memory is operated at the highest frequency of the various frequencies suitable to the flash memory; and
to write the flash memory, the flash memory is operated at the next highest frequency of the various frequencies suitable to the flash memory or the clock signal of the flash memory is switched between the highest and the next highest frequencies of the various frequencies suitable to the flash memory.

13. The flash memory control method as claimed in claim 10, wherein:
the highest and the next highest frequencies of the various frequencies suitable to the flash memory are determined for determining the clock candidates;
to sequentially read or write the flash memory, the flash memory is operated at the highest frequency of the various frequencies suitable to the flash memory; and
to randomly read or write the flash memory, the flash memory is operated at the next highest frequency of the various frequencies suitable to the flash memory or the clock signal of the flash memory is switched between the highest and the next highest frequencies of the various frequencies suitable to the flash memory.

14. The flash memory control method as claimed in claim 9, starting an overclocking test of the flash memory from a test clock at a maximum frequency of the various frequencies and gradually slowing the flash memory under the overclocking test by switching between the test clocks.

15. The flash memory control method as claimed in claim 9, further comprising:
driving a data transmission line in accordance with one set of driving parameters for data transmission into the flash memory; and
modifying the set of driving parameters for correct acquisition of data transmitted on the data transmission line when the flash memory is tested by the test clocks.

16. The flash memory control method as claimed in claim 9, further comprising:
transmitting data into the flash memory through a data transmission line; and
switching the flash memory to operate at a single data rate for correct acquisition of data transmitted on the data transmission line.

* * * * *